(12) United States Patent
Hwang

(10) Patent No.: US 7,197,057 B2
(45) Date of Patent: Mar. 27, 2007

(54) SEMICONDUCTOR LASER DEVICE AND METHOD OF FABRICATING THE SAME

(75) Inventor: Sun-Lyeong Hwang, Suwon-si (KR)

(73) Assignee: Samsung Electronics Co, Ltd., Gyeonggi-Do (KR)

( * ) Notice: Subject to any disclaimer, the term of this patent is extended or adjusted under 35 U.S.C. 154(b) by 251 days.

(21) Appl. No.: 10/896,344

(22) Filed: Jul. 21, 2004

(65) Prior Publication Data

US 2005/0152418 A1     Jul. 14, 2005

(30) Foreign Application Priority Data

Jan. 8, 2004   (KR) .................... 10-2004-0001204

(51) Int. Cl.
*H01S 5/24* (2006.01)
(52) U.S. Cl. ................................ 372/46.01
(58) Field of Classification Search ............ 372/46.01
See application file for complete search history.

(56) References Cited

U.S. PATENT DOCUMENTS

| | | | | |
|---|---|---|---|---|
| 4,974,233 A | * | 11/1990 | Suzuki et al. ............ 372/46.01 |
| 5,058,120 A | * | 10/1991 | Nitta et al. .............. 372/46.01 |
| 5,533,041 A | * | 7/1996 | Matsuda et al. .......... 372/50.1 |
| 2003/0138016 A1 | * | 7/2003 | Kise et al. .................. 372/46 |
| 2003/0179794 A1 | * | 9/2003 | Mihashi et al. .............. 372/46 |

* cited by examiner

*Primary Examiner*—Minsun Oh Harvey
*Assistant Examiner*—Rory Finneren
(74) *Attorney, Agent, or Firm*—Cha & Reiter, LLC

(57) ABSTRACT

The width of a current pass region of a semiconductor laser device is narrowed as much as possible, thus implementing a stable single transverse mode. The device is relatively resistant against physical impact. The device includes a semiconductor substrate having first and second opposite surfaces, and, in order, a first conductive type clad, active layer, etch stop layer, current blocking layer formed in a V-groove shape so that a part of the etch stop layer is exposed, second conductive type clad formed entirely over the entire of the V-groove and the current blocking layer, optical guide layer, current pass facilitation layer, cap layer, second conductive type electrode, and a first conductive type electrode formed on the second surface of the semiconductor substrate.

20 Claims, 5 Drawing Sheets

SEMICONDUCTOR LASER DEVICE AND METHOD OF FABRICATING THE SAME

CLAIM OF PRIORITY

This application claims priority to an application entitled "Semiconductor Laser Device and Method of Fabricating the Same," filed with the Korean Intellectual Property Office on Jan. 8, 2004 and assigned Serial No. 2004-1204, the contents of which are hereby incorporated by reference.

BACKGROUND OF THE INVENTION

1. Field of the Invention

The present invention relates to a semiconductor laser device and method of fabricating the same, and, in particular to a device in which a width of a current pass region is controlled in the device, thereby stabilizing a single transverse mode.

2. Description of the Related Art

Four-element systems, as such as InGaAsP, AlGaInAs, etc., are commonly in use as InP-based semiconductor compounds for optical communication semiconductor lasers, and recently, AlGaInAs based materials have become spotlighted to a great extent, as a result of rising demand for greater high-temperature properties and high-speed modulation properties of optical communication devices. AlGaInAs based materials have good temperature properties due to large band offset in a conduction band and properties advantageous in high modulation due to small band offset in a valence band, as compared to InGaAsP based materials. However, because AlGaInAs based materials contain aluminum, oxidation film is naturally formed when the AlGaInAs based materials are exposed to the air; therefore, re-growth is not easy, and thus it is difficult to implement a device. Accordingly, when devices are fabricated using AlGaInAs based materials, an RWG (Ridge Wave Guide), a BR (Buried Ridge) or the like is usually used. Such an RWG or BR forms a ridge, thereby performing current injection and optical guiding, which has been widely used until now as a technique for fabricating laser diodes without exposing an active region.

FIG. 1 is a cross-sectional view schematically showing a construction of an RWG type laser device 10. Referring to FIG. 1, the RWG type laser device 10 is a type having a projected ridge 16, which is formed principally in a reversed trapezoid form, and is formed from a clad layer 15. The layers underlying the clad layer 15 are, in order, an etch stop layer 14, a space layer 13, an active layer 12 and a substrate 11.

However, such a conventional RWG laser device 10 is fragile to physical impact, because the ridge 16 is projected. The ridge 16, is therefore likely to be fractured during the fabrication process. Furthermore, it is very difficult to form an ohmic contact layer on a mesa whose size is a few micrometers. In addition, such a projected ridge may be the cause of increasing chip resistance.

It is also necessary to reduce the thickness of the space layer 13 to mitigate current spreading in an area adjacent to the active layer 12. In so doing, however, optical guiding becomes too intensive in trenches 17, thereby deteriorating a mode characteristic and causing a kink.

Implementing an optical communication device of high quality is problematic, due to limits on mesa width and space layer thickness reduction for the conventional RWG type laser device.

FIG. 2 is a cross-sectional view schematically showing a construction of a conventional BR type laser device 20 comprising a substrate 21, an active layer 22, a space layer 23, an etch stop layer 24, a current blocking layer (CBL) 25, a ridge 26, and a clad 27.

With the BR type laser device 20, it is difficult to fabricate the ridge in a reversed trapezoid form due to re-growth of the current blocking layer 25. Because the ridge is widened just above the active layer 22, electric current is not collected on one side but spread out, the unavoidable result of which is an unstable mode characteristic.

SUMMARY OF THE INVENTION

The present invention has been made to solve the above-mentioned problems occurring in the prior art, and an object of the present invention is to provide a semiconductor laser device, in which a width of a current pass region is narrowed as much as possible, thus implementing a stable single transverse mode, and which is relatively stable to physical impact, and a method of fabricating the same.

In order to achieve the above object, according to an aspect of the present invention, there is provided a semiconductor laser device, and method for forming the device, the device including a semiconductor substrate having a first surface and a second surface which are opposite to one another. The device further includes, in order, a first conductive type clad, an active layer, an etch stop layer, a current blocking layer formed in a V-groove shape so that a part of the etch stop layer is exposed, a second conductive type clad formed over the entire of the V-groove and the current blocking layer, an optical guide layer, a current pass facilitation layer; a cap layer, a second conductive type electrode, and a first conductive type electrode formed on the second surface of the semiconductor substrate.

Preferably, the semiconductor laser device further comprises a grating formed on any one of top and bottom sides of the active layer, and the active layer has a structure with at least two laminated semiconductor layers and contains an AlGaInAs based material. It is also preferable that the optical guide layer is formed from p-InGaAsP, the current pass facilitation layer is formed from p-InP, and the cap layer is formed from p-InGaAs. Due to a migration effect of growth, p-InGaAsP optical guide layer is formed thicker in V-groove area than plat area.

According to a second aspect of the present invention, there is provided a semiconductor laser device that includes a semiconductor substrate having a first surface and a second surface that are opposite to one another, and, in order, a first conductive type clad, an active layer, an etch stop layer, a current blocking layer formed in a V-groove shape so that a part of the etch stop layer is exposed, a second conductive type clad formed over the entire of the V-groove and the current blocking layer, an optical guide layer, a current pass facilitation layer, a cap layer, a second conductive type electrode, a first conductive type electrode formed on the second surface of the semiconductor substrate, and first and second trenches formed at right and left sides of the V-groove by etching from the cap layer to the first conductive type clad. It can also increase frequency bandwidth of device reducing parasitic capacitance.

Preferably, the active layer has a structure with at least two laminated semiconductor layers and the second conductive type clad is re-grown by metal organic chemical vapor deposition.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Preferred embodiments of the present invention are described with reference to the accompanying drawing. Details of known functions and configurations incorporated herein are omitted for clarity of presentation.

Figure 1:
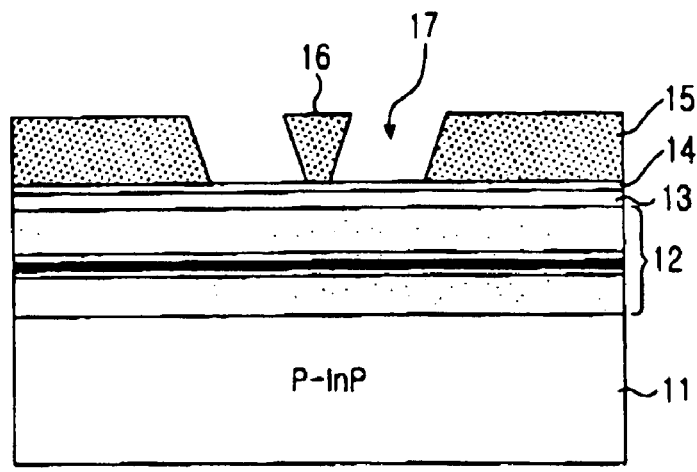
FIG. 1 is a cross-sectional view schematically showing a construction of a conventional RWG type laser device.
Figure 2:
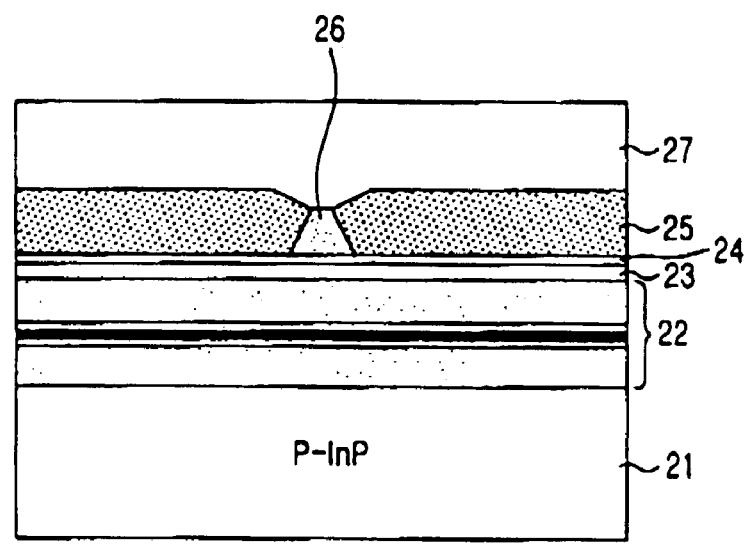
FIG. 2 is a cross-sectional view schematically showing a construction of a conventional BR type laser device.
Figure 3:
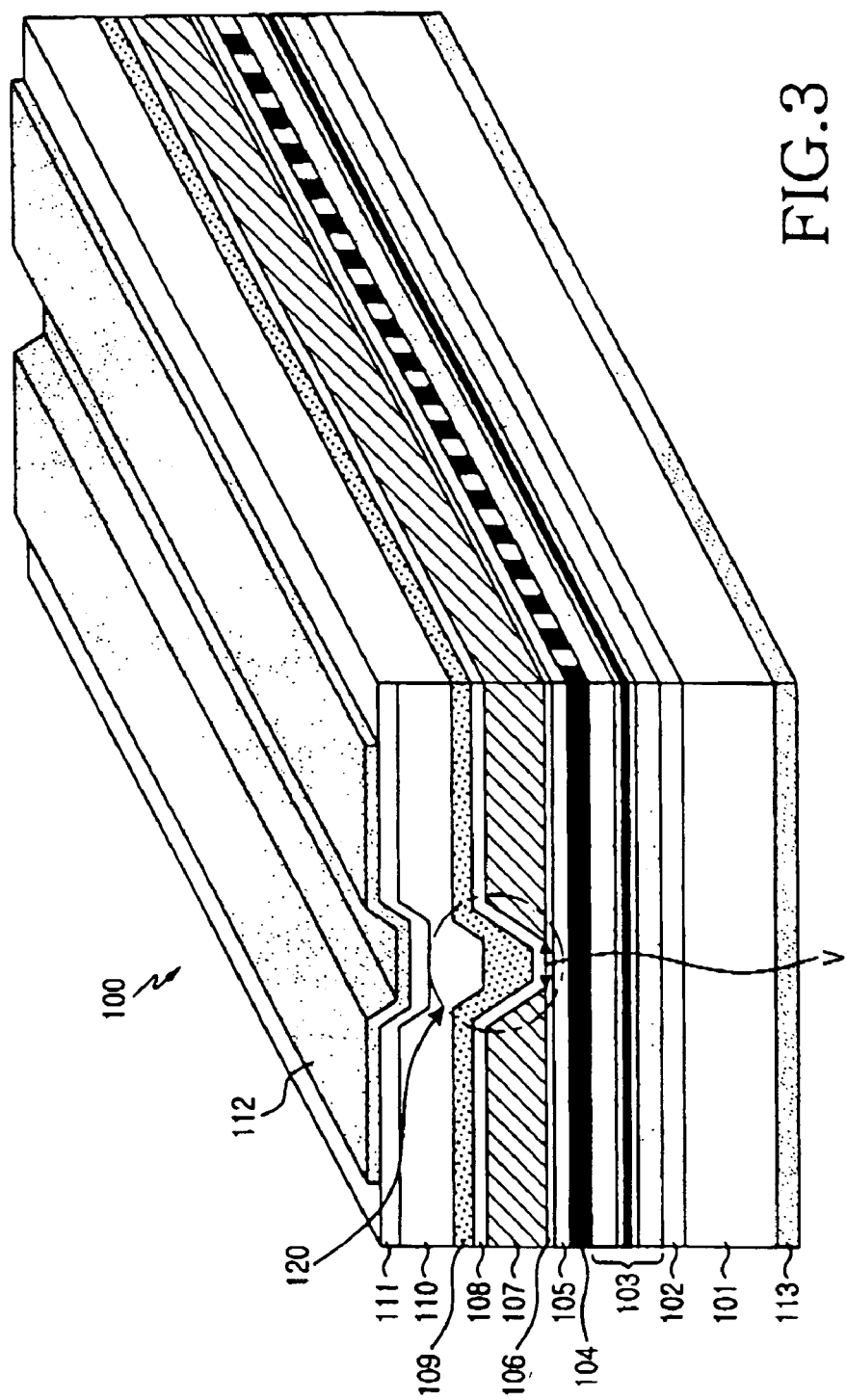
FIG. 3 is a perspective view of an exemplary semiconductor laser device according to an embodiment of the present invention.

FIG. 3 is a perspective view showing, by way of illustrative and non-limitative example, a semiconductor laser device 100 according to an embodiment of the present invention. The semiconductor laser device 100 is formed in such a manner that an n-InP clad 102, an AlGaInAs MQW active layer 103, a grating 104, a p-InP space layer 105, and an etch stop layer 106 are sequentially laminated on an n-InP substrate 101, and then a current blocking layer (CBL) 107 is formed on the etch stop layer to have a V-groove shape. Then, a p-InP clad 108, a p-InGaAsP optical guide layer 109, a p-InP current pass facilitation layer 110, a p-InGaAs cap layer 111, and a p-electrode 112 are formed over the current blocking layer 107 and the V-groove region 120, and an n-electrode 113 is formed on the bottom surface of the n-InP substrate 113.

In the above-mentioned construction, the bottom or base of the V-groove forms a current pass channel of width V, a parameter that can be adjusted at the time of etching in forming the V-groove. Therefore, it is possible to collect current on one side by narrowing the current pass channel.

The grating 104 in this embodiment is formed on the top of the active layer 103. However, it may be formed on the bottom of the active layer 103.

FIGS. 4A to 4E depict an exemplary process for fabricating the semiconductor laser device 100 according to an embodiment of the present invention.

Figure 4A:
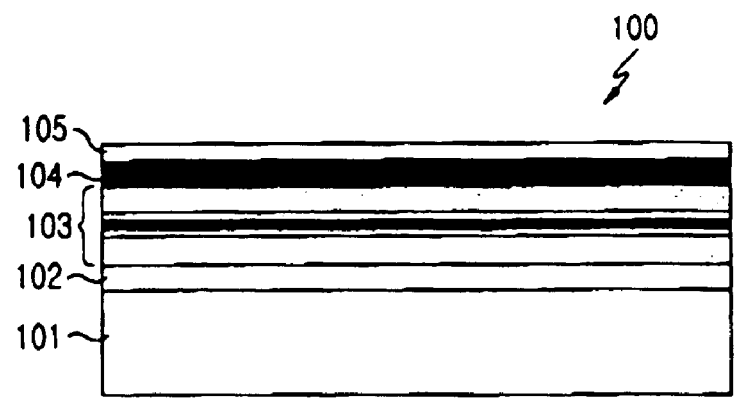
FIGS. 4A to 4E show steps for fabricating the semiconductor laser device shown in FIG. 3.

As shown in FIG. 4A, an n-InP clad 102, an AlGaInAs MQW active layer 103 and a grating 104 are formed on an n-InP substrate 101.

Figure 4B:
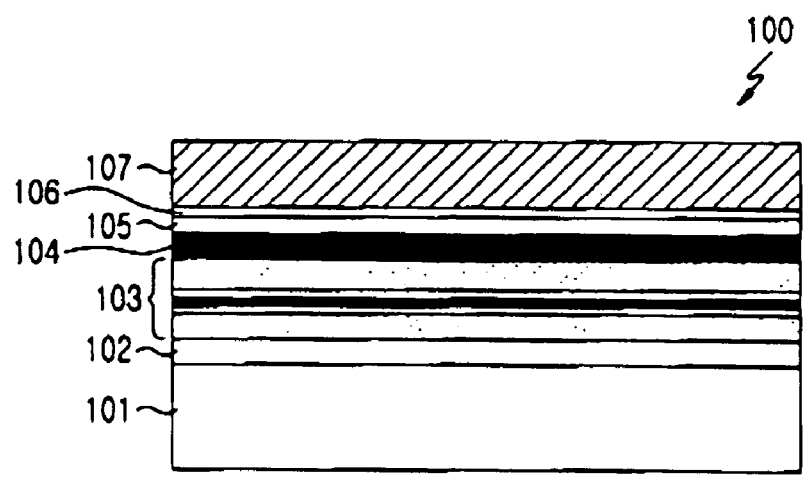

Then, referring to FIG. 4B, a space layer 105, an etch stop layer 106 and a current blocking layer 107 are sequentially formed on the grating 104 through re-growth.

Figure 4C:
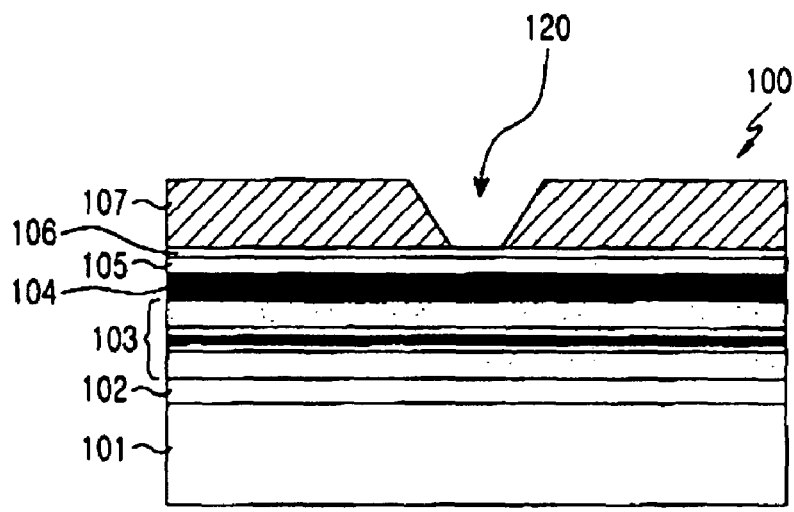

A V-groove 120 is next formed by etching the current blocking layer 107, as seen in FIG. 4C. Herein, the current blocking layer 107 is etched to the etch stop layer 106, so that the etch stop layer is exposed at the bottom of the V-groove, that bottom forming a current pass channel.

Figure 4D:
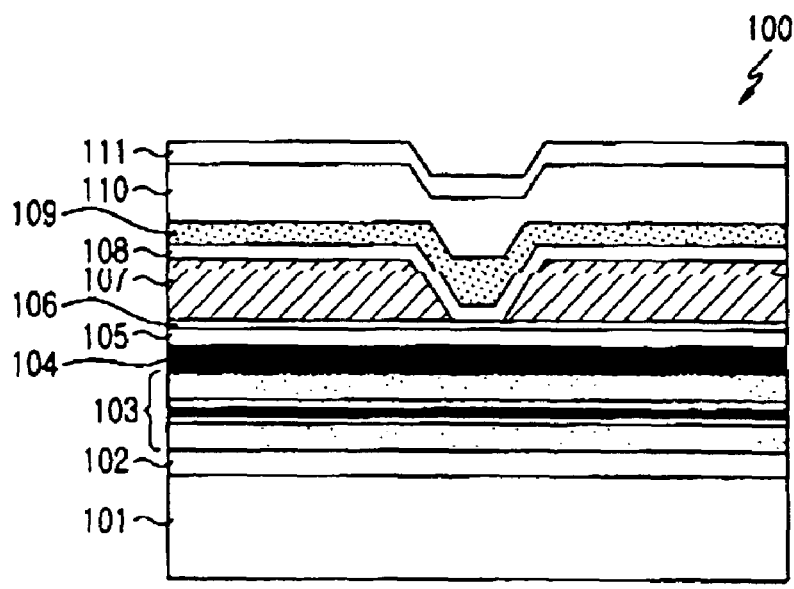

In FIG. 4D, a p-InP clad 108, a p-InGaAsP optical guide layer 109, a p-InP current pass facilitation layer 110, and a p-InGaAs cap layer 111 are grown and laminated on the entire top of the construction formed with the V-groove by metal organic chemical vapor deposition (MOCVD). As the wafer rotates at high speed during the grain growth, a surface migration effect of growing material is produced, filling the V-groove. The extent of filling can be properly adjusted, because various factors such as growing rate and growing temperature serve as variables. In addition, because the p-InGaAsP optical guide layer 109 is thicker than the underlying p-InP layer, the optical guide layer controls the vertical beam divergence according to its thickness. Optical field in the V-groove is accordingly increased in comparison to the surrounding part when the grain growth proceeds in the V-groove. Advantageously, it is therefore possible to selectively reduce the beam divergence.

Figure 4E:
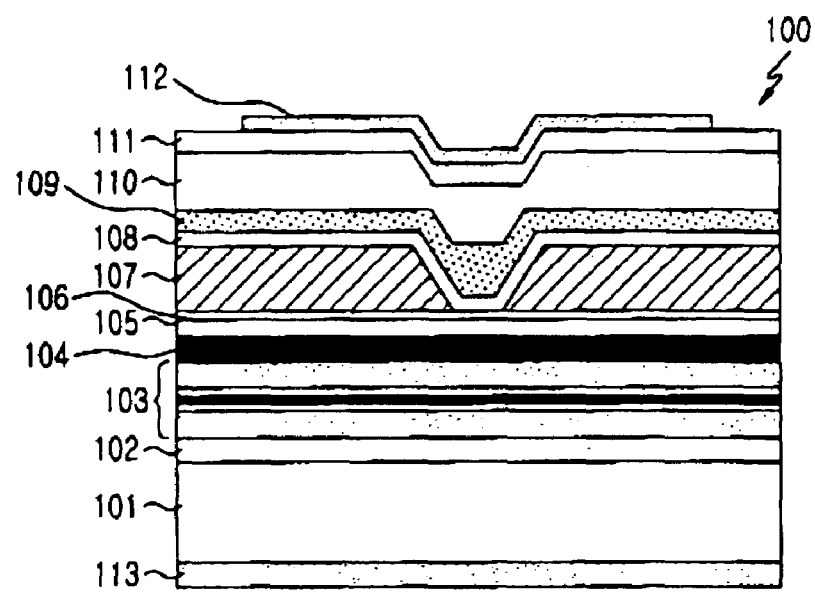

As shown in FIG. 4E, a p-electrode 112 is formed on the p-InGaAs cap layer 111 and an n-electrode 113 is formed on the bottom surface of the n-InP substrate 101.

Figure 5:
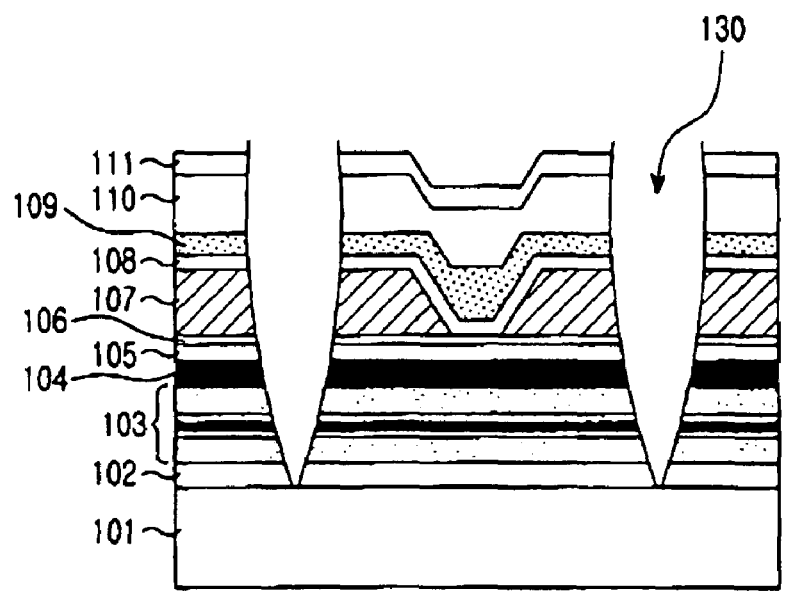
FIG. 5 is a cross-sectional view showing an additional stage for fabricating a semiconductor laser device according to another embodiment of the present invention.

FIG. 5 shows one of various steps of fabricating a semiconductor laser device according to another embodiment of the present invention. In particular, after a stage corresponding to the embodiment depicted in FIG. 4D, etching is performed from the cap layer 111 to the n-InP clad 102, thereby forming trenches 130 at the both sides of the V-groove. The trenches enhance modulation properties by reducing parasitic capacitance, and are mainly useful in the process of fabricating a high-speed device.

As described above, according to the present invention, a current pass region is formed in a V-groove shape, thereby allowing a single transverse mode to be implemented by narrowing the width of a current pass channel. In addition, because the optical guide layer is formed to be thicker in the V-groove than in the surrounding part, it is possible to selectively adjust vertical beams.

It is, moreover, easy to handle the chip, because a ridge formed in the chip is relatively resistant against physical impact.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor laser device comprising:
   a semiconductor substrate having a first surface and a second surface that are opposite to one another;
   a first conductive type clad formed on the first surface of the semiconductor substrate;
   an active layer formed on the first conductive type clad;
   an etch stop layer formed on the active layer;
   a current blocking layer formed in a V-groove shape so that a part of the etch stop layer is exposed;
   a second conductive type clad formed entirely over the V-groove and the current blocking layer;
   an optical guide layer formed on the second conductive type clad, wherein the optical guide layer is formed to be thicker in the V-groove than in the surrounding part;
   a current pass facilitation layer;
   a cap layer formed on the current pass facilitation layer;
   a second conductive type electrode formed on the cap layer; and
   a first conductive type electrode formed on the second surface of the semiconductor substrate.

2. The semiconductor laser device as claimed in claim 1, wherein the active layer has a top and a bottom, said device further comprising a grating formed either on the top or the bottom of the active layer.

3. The semiconductor laser device as claimed in claim 2, wherein the active layer has a structure with at least two laminated semiconductor layers and contains an AlGaInAs based material.

4. The semiconductor laser device as claimed in claim 1, wherein the active layer has a structure with at least two laminated semiconductor layers and contains an AlGaInAs based material.

5. The semiconductor laser device as claimed in claim 1, wherein the optical guide layer is formed from p-InGaAsP.

6. The semiconductor laser device as claimed in claim 1, wherein the first conductive type is n-type and the second conductive type is p-type.

7. A semiconductor laser device comprising:
a semiconductor substrate having a first surface and a second surface that are opposite to one another;
a first conductive type clad formed on the first surface of the semiconductor substrate;
an active layer formed on the first conductive type clad;
an etch stop layer formed on the active layer;
a current blocking layer formed in a V-groove shape so that a part of the etch stop layer is exposed;
a second conductive type clad formed entirely over the V-groove and the current blocking layer;
an optical guide layer formed on the second conductive type clad, wherein the optical guide layer is formed to be thicker in the V-groove than in the surrounding part;
a current pass facilitation layer;
a cap layer formed on the current pass facilitation layer;
a second conductive type electrode formed on the cap layer;
a first conductive type electrode formed on the second surface of the semiconductor substrate; and
first and second trenches formed at respectively opposite sides of the V-groove by etching from the cap layer to the first conductive type clad.

8. The semiconductor laser device as claimed in claim 7, wherein the active layer has a top and a bottom, said device further comprising a grating formed either on the top or the bottom of the active layer.

9. The semiconductor laser device as claimed in claim 8, wherein the active layer has a structure with at least two laminated semiconductor layers and contains an AlGaInAs based material.

10. The semiconductor laser device as claimed in claim 7, wherein the active layer has a structure with at least two laminated semiconductor layers and contains an AlGaInAs based material.

11. A method for fabricating a semiconductor laser device comprising the steps of:
providing a semiconductor substrate having a first surface and a second surface that are opposite to one another;
forming a first conductive type clad on said first surface;
forming an active layer on the first conductive type clad;
forming an etch stop layer on the active layer;
forming a V-groove, by forming a current blocking layer in a V-groove shape so that a part of the etch stop layer is exposed, the V-groove having a top;
forming a second conductive type clad entirely over said top and the current blocking layer;
forming an optical guide layer on the second conductive type clad, wherein the optical guide layer is formed to be thicker in the V-groove than in the surrounding part;
forming a current pass facilitation layer;
forming a cap layer on the current pass facilitation layer;
forming a first conductive type electrode on the cap layer; and
forming a second conductive type electrode on the second surface of the semiconductor substrate.

12. The method as claimed in claim 11, further comprising the step of forming a grating on any one of top and bottom sides of the active layer.

13. The method as claimed in claim 12, wherein the V-groove has opposite sides, said method further comprising the step of performing etching from the cap layer to the semiconductor substrate after forming the cap layer, thereby forming a trench at each of the opposite sides of the V-groove.

14. The method as claimed in claim 12, wherein the active layer has a structure with at least two laminated semiconductor layers.

15. The method as claimed in claim 12, wherein the second conductive type clad is re-grown by metal organic chemical vapor deposition.

16. The method as claimed in claim 15, wherein the second conductive type clad is formed of p-InP.

17. The method as claimed in claim 11, wherein the second conductive type clad is re-grown by metal organic chemical vapor deposition.

18. The method as claimed in claim 17, wherein the second conductive type clad is formed of p-InP.

19. The method as claimed in claim 11, wherein the V-groove has opposite sides, said method further comprising the step of performing etching from the cap layer to the semiconductor substrate after forming the cap layer, thereby forming a trench at each of the opposite sides of the V-groove.

20. The method as claimed in claim 11, wherein the active layer has a structure with at least two laminated semiconductor layers.

* * * * *